(12) United States Patent
Chen et al.

(10) Patent No.: US 11,171,635 B2
(45) Date of Patent: Nov. 9, 2021

(54) CIRCUITS AND METHODS OF OPERATING THE CIRCUITS

(71) Applicant: SK hynix Inc., Gyeonggi-do (KR)

(72) Inventors: Xiaofang Chen, Milpitas, CA (US); Wenwei Wang, San Jose, CA (US); Danyang Qiao, Santa Clara, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/800,630

(22) Filed: Feb. 25, 2020

(65) Prior Publication Data

US 2021/0265988 A1 Aug. 26, 2021

(51) Int. Cl.
*H03K 3/356* (2006.01)
*H03K 19/0185* (2006.01)

(52) U.S. Cl.
CPC ... *H03K 3/35613* (2013.01); *H03K 3/356182* (2013.01); *H03K 19/018521* (2013.01)

(58) Field of Classification Search
None
See application file for complete search history.

(56) References Cited

U.S. PATENT DOCUMENTS

| | | | | |
|---|---|---|---|---|
| 3,751,680 A | * | 8/1973 | Hodges | H03K 19/013 326/90 |
| 5,030,852 A | * | 7/1991 | Higashisaka | H03K 19/0952 326/33 |
| 5,661,411 A | * | 8/1997 | Nguyen | H03K 19/0948 326/121 |
| 8,085,078 B2 | | 12/2011 | Honda | |
| 2003/0107426 A1 | | 6/2003 | Foroudi et al. | |

* cited by examiner

*Primary Examiner* — Jany Richardson
(74) *Attorney, Agent, or Firm* — IP & T Group LLP (57) ABSTRACT

Circuits integrating OR logic and level shifting functionality and methods of operating the same are configured to accommodate different applications. One such circuit comprises first and second transistors coupled in parallel defining first and second nodes, the first transistor being responsive to a first input signal and the second transistor being responsive to a second input signal; a first resistor coupled between a power supply terminal of the circuit and the first node; and a second resistor coupled between the second node and a ground terminal of the circuit. The circuit generates an output signal having a voltage level that is lower than a voltage level of each of the first and second input signals.

16 Claims, 11 Drawing Sheets

| Inputs | | Output |
|---|---|---|
| A | B | C |
| 0 | 0 | 0 |
| 0 | 1 | 1 |
| 1 | 0 | 1 |
| 1 | 1 | 1 |

CIRCUITS AND METHODS OF OPERATING THE CIRCUITS

BACKGROUND

1. Field

Embodiments of the present disclosure relate to circuits for systems and devices, particularly high density storage devices, and a method of operating the circuits.

2. Description of the Related Art

The computer environment paradigm has shifted to ubiquitous computing that can be used virtually anytime and anywhere. As a result, the use of portable electronic devices, such as mobile phones, digital cameras, and notebook computers has rapidly increased. These portable electronic devices generally use a memory system having memory device(s), that is, data storage device(s). A data storage device is used as a main memory device or an auxiliary memory device of the portable electronic devices.

Data storage devices used as memory devices provide excellent stability, durability, high information access speed, and low power consumption, since they have no moving parts. Examples of data storage devices having such advantages include universal serial bus (USB) memory devices, memory cards having various interfaces, and SSDs.

An OR gate integrated circuit (IC) and a level shifter IC are commonly used together in digital circuit design in memory systems, as well as in other electronic components, to realize a logic OR function with a lower output voltage than the OR gate itself generates. The lower output voltage is needed to meet certain input/output (I/O) requirements for microcontroller units (MCUs) in System-on-chip (SoC) applications, e.g., to meet MCU/SoC I/O specifications.

In this context embodiments of the present invention arise.

SUMMARY

Embodiments of the present invention provide circuits that combine the functionality of OR gate(s) and a level shifter, and methods of operating the circuits. The circuits are efficient in many respects including application, operation, construction, footprint and flexibility.

An aspect of the present invention is directed to circuits. One such circuit comprises first and second transistors coupled in parallel defining first and second nodes, the first transistor being responsive to a first input signal and the second transistor being responsive to a second input signal; a first resistor coupled between a power supply terminal of the circuit and the first node; and a second resistor coupled between the second node and a ground terminal of the circuit. The circuit generates an output signal having a voltage level that is lower than a voltage level of each of the first and second input signals.

In another aspect, the present invention is directed to methods of operating a circuit. One such method comprises applying a first input signal to a first transistor of the circuit; applying a second input signal to a second transistor of the circuit, the second transistor being coupled in parallel with the first transistor; applying a power supply voltage to a power supply terminal of the circuit through a first resistor coupled between the power supply terminal and a first node coupling the first and second transistors; and generating an output signal on a second node coupling the first and second transistors, the second node being coupled to a second resistor that is coupled to ground. The output signal generated has a voltage level that is lower than a voltage level of each of the first and second input signals.

Additional aspects of the present invention will become apparent from the following description.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention.

Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

Figure 1:
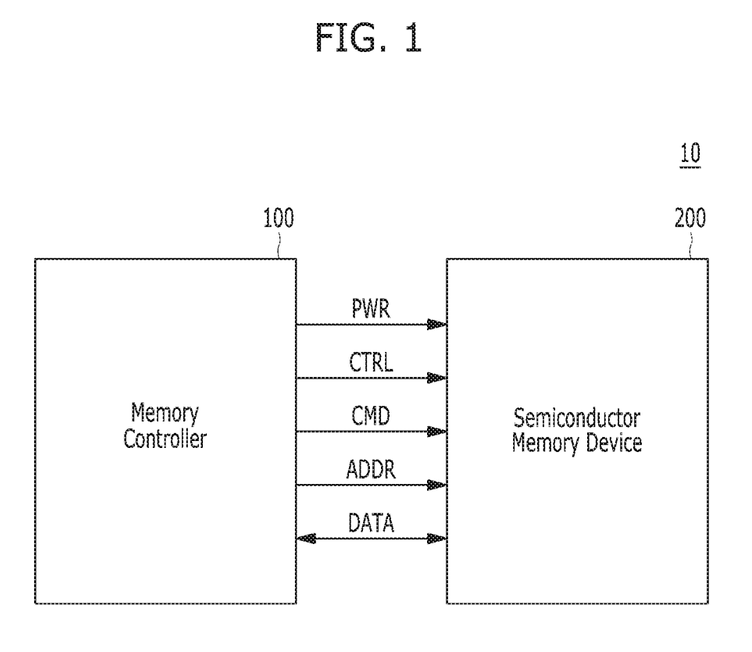
FIG. 1 is a block diagram illustrating a memory system in accordance with an embodiment of the present invention.

FIG. 1 is a block diagram schematically illustrating a memory system in accordance with an embodiment of the present invention.

Referring to FIG. 1, the memory system 10 may include a memory controller 100 and a semiconductor memory device 200, which may represent more than one such device. The semiconductor memory device(s) 200 may be flash memory device(s), particularly of the NAND-type. For brevity, memory controller 100 and semiconductor memory device 200 are sometimes simply referred to below as controller 100 and memory device 200, respectively.

The controller 100 may control overall operations of the memory device 200.

The memory device 200 may perform one or more erase, program, and read operations under the control of the memory controller 100. The memory device 200 may receive a command CMD, an address ADDR and data DATA through input/output (I/O) lines. The memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the memory system 10 is used in an SSD, operation speed of a host (not shown) coupled to the memory system 10 may remarkably improve.

In another embodiment, the memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC) card, and/or a universal flash storage (UFS).

In still another embodiment, the memory system 10 may be provided as one of various components in an electronic device, such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
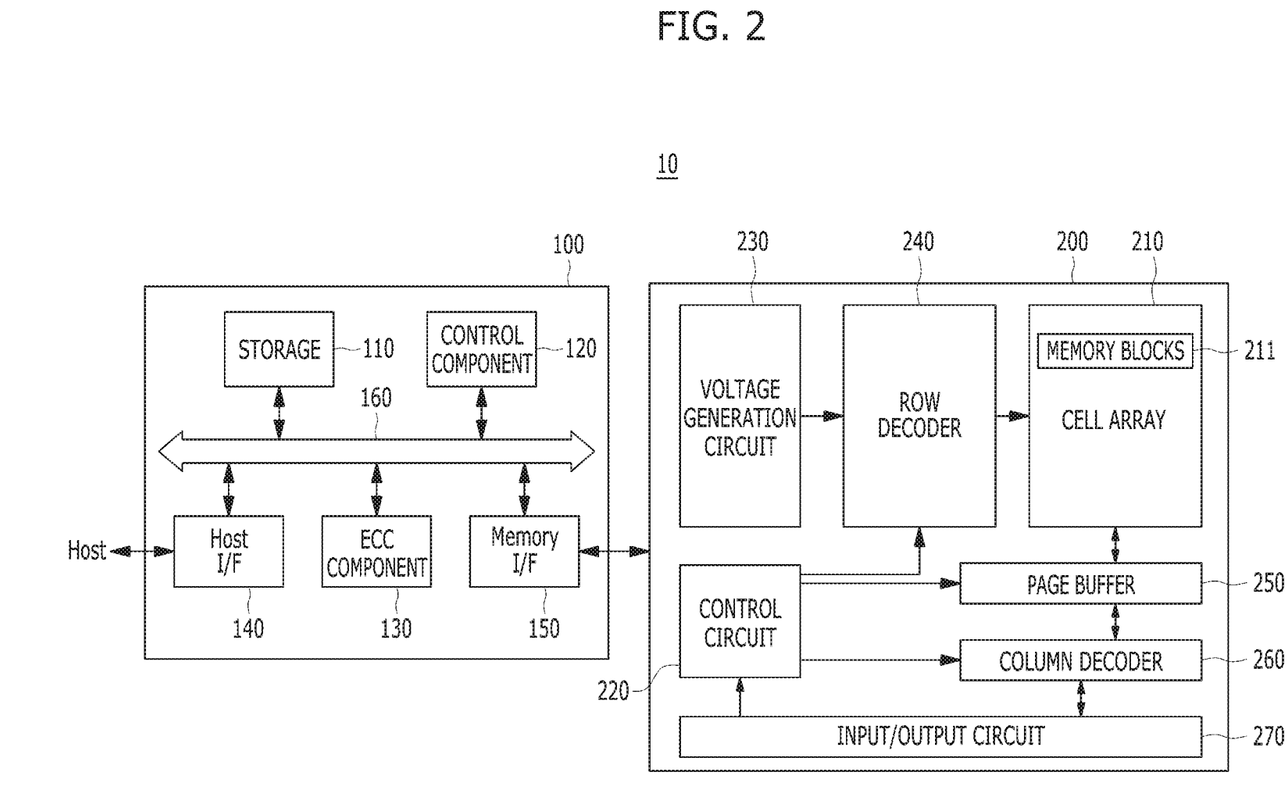
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented as any of various types of electronic devices. In some embodiments, the host device may include an electronic device, such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device, such as a mobile phone, a smart phone, an e-book, an MP3 player, a portable multimedia player (PMP), and/or a portable game player.

The memory device 200 may store data to be accessed by the host device.

The memory device 200 may be implemented as a volatile memory device, such as a dynamic random access memory (DRAM) and/or a static random access memory (SRAM) or a non-volatile memory device, such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor, e.g., a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented as a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations, such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure to correct the error bits.

The ECC component 130 may perform an error correction operation based on a coded modulation, such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM). The ECC component 130 may include any and all circuits, systems or devices for suitable error correction operation, in accordance with embodiments of the present invention.

The host interface 140 may communicate with the host device through one or more of various interface protocols, such as a universal serial bus (USB), a multi-media card (MMC), a peripheral component interconnect express (PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer (array) 250, the column decoder 260 and the input/output circuit 270 may form a peripheral circuit for the memory cell array 210. The peripheral circuit ay perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
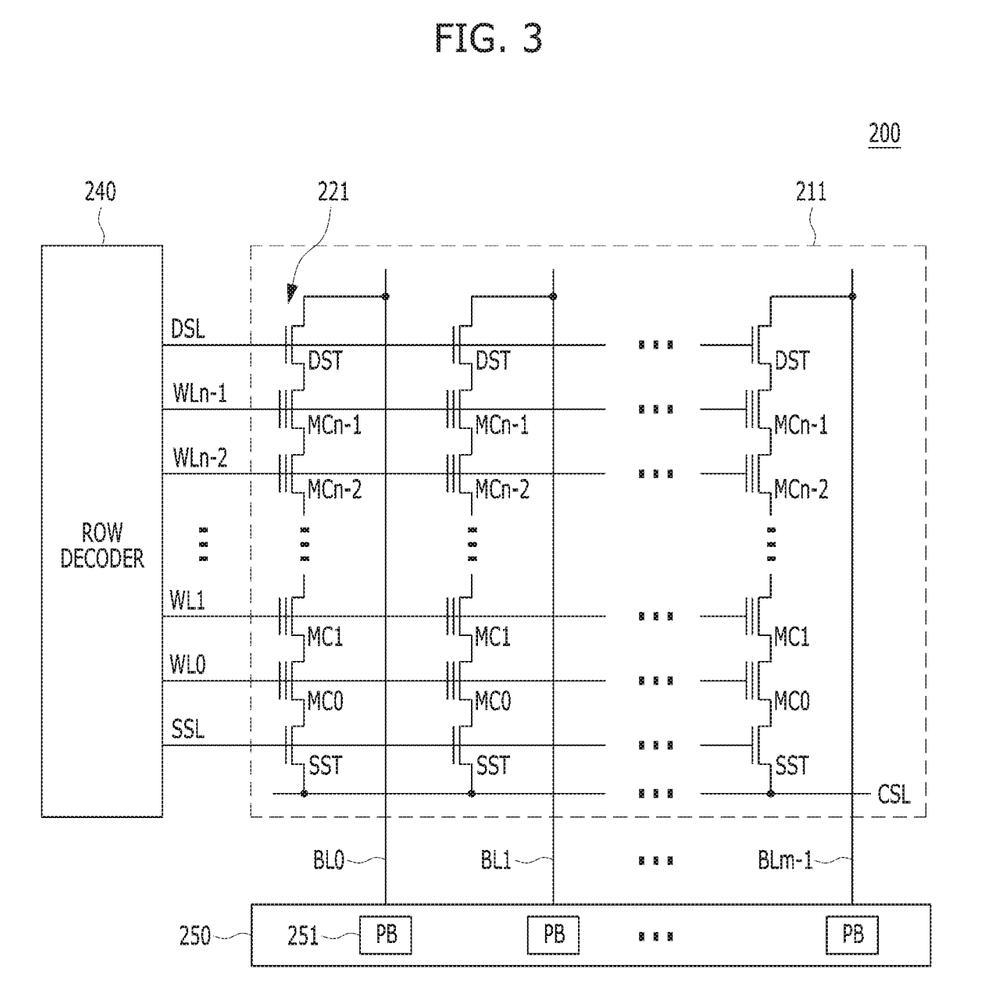
FIG. 3 is a circuit diagram illustrating a memory block of a memory device of a memory system in accordance with an embodiment of the present invention.

The page buffer (array) 250 may be in electrical communication with the memory cell array 210 through bit lines BL (shown in FIG. 3). The page buffer (array) 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the memory block 211 may include a plurality of word lines WL0 to WLn−1, a drain select line DSL and a source select line SSL coupled to the row decoder 240. These lines may be arranged in parallel with the plurality of word lines between the DSL and SSL.

The memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

As previously noted, an OR gate/level shifter assembly is used to lower the input voltage (typically 3.3V) to various electronic components to meet applicable specification requirements, e.g., MCU/SoC I/O specification requirements.

Figure 4:
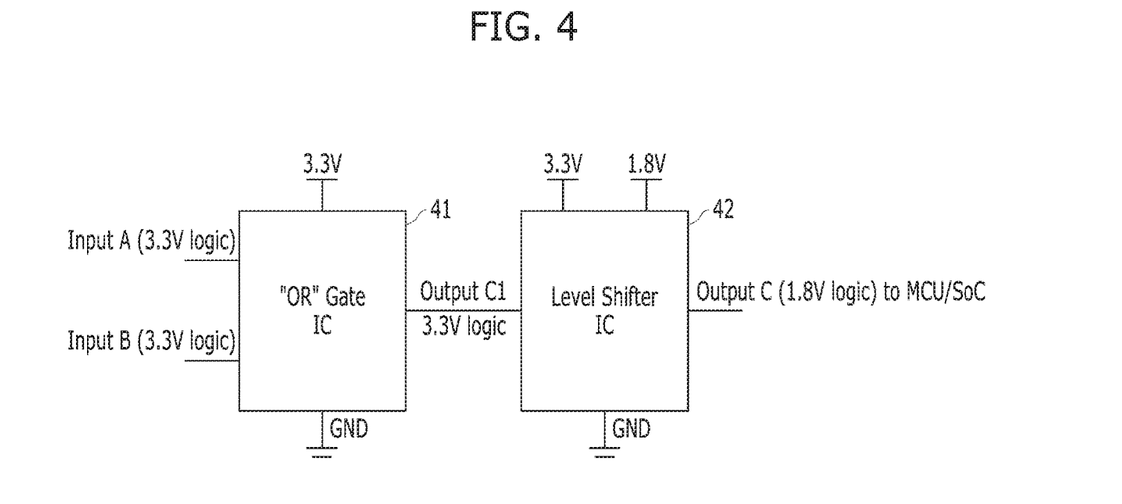
FIG. 4 is a schematic diagram illustrating a structure of an OR gate and level shifter.

FIG. 4 illustrates one common OR gate/level shifter construction. Here, OR gate 41 receives input signals (Input A and Input B), each having a voltage of 3.3V. OR gate 41 performs a logic OR operation on the input signals to generate an output signal (Output C1) also of 3.3V. Output C1 is then input to level shifter 42, which lowers the voltage to 1.8V, and outputs that voltage in the form of Output C, which is applied to another electronic component, e.g., an MCU/SoC. The OR gate 41 operates on a single power supply of 3.3V, while the level shifter 42 has dual power supply terminals. 3.3V is applied to one and 1.8V to the other. Thus, the combination circuit (OR gate 41 and level shifter 42) requires two different power supply voltages.

Figure 5:
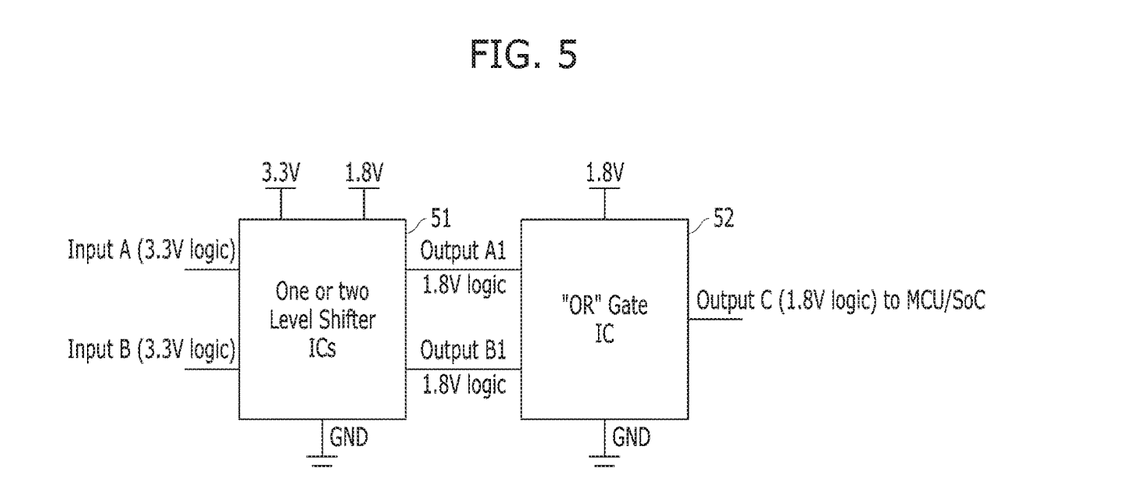
FIG. 5 is a schematic diagram illustrating another structure of an OR gate and level shifter.

Alternatively, the same functionality of the circuit of FIG. 4 can be realized in the less common construction shown in FIG. 5. Here, level shifter 51 (of which there may be multiple instances) receives the input voltages (Input A and Input B), each having a voltage of 3.3V, lowers the voltage of each input to 1.8V, and generates two outputs (Output A1 and Output B1), each having a voltage of 1.8V. Output A1 and Output B1 then form the inputs to OR gate 52, which performs the logic OR operation on those inputs and outputs the resulting signal (Output C) which is also 1.8V. As with the construction shown in FIG. 4, the combination circuit (level shifter 51 and OR gate 52) of FIG. 5 also requires two different power supply voltages.

Nowadays high density circuits including storage devices such as HDDs (Hard Disk Drives) and SSDs (Solid State Drives) have less space to accommodate more parts. Thus, ore MCU/SoC designs are adopting lower I/O voltage levels (1.8V or 1.2V) to minimize power consumption, although higher voltage (2.5V or higher) I/Os still exist. This presents a new challenge to circuit designers on how to reduce printed circuit board (PCB) footprint and component costs, while still providing the same circuit functions.

Currently, SoC and data storage IC devices in SSDs tend to adopt lower voltage I/Os, such as 1.8V and 1.2V, to save power, while legacy devices that employ higher voltage IOs, such as 3.3V and 2.5V, are still in use, especially in the host boards which interface with the SSDs. The co-existence of devices and components with different I/O voltages requires voltage level-shifting ICs in between for proper signal level matching. This introduces two challenges to circuit designers: how to fit the extra parts into the already-crowded PCBs, and how to reduce the cost of the extra parts.

Embodiments of the present invention are directed to solving these challenges. One promising solution, discovered by the inventors, combines the level shifting function with the existing logic circuits so a single circuit would perform the same logic function, together with the level shifting. To that end, embodiments of the present invention provide an improved OR gate and level shifter design and configuration.

Figure 6:
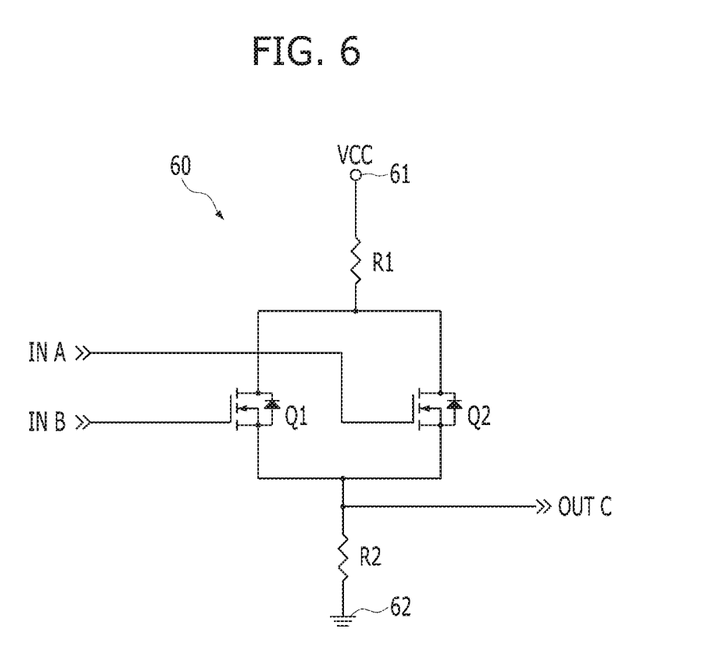
FIG. 6 is a circuit diagram illustrating a circuit in accordance with an embodiment of the present invention.

FIG. 6 is a circuit diagram of an OR gate and level shifter circuit assembly 60 according to an embodiment of the present invention. The circuit assembly 60 performs the required functions, e.g., those performed by the circuits in FIGS. 4 and 5, respectively, but does so more efficiently. In particular, the circuit assembly 60, which includes both OR logic and level shifting functionality, is designed and configured to save space and cost.

Figure 7:
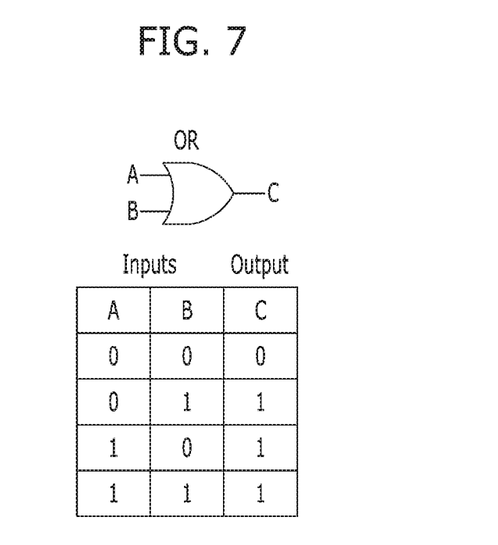
FIG. 7 is the truth table for the circuit shown in FIG. 6.

Referring to FIG. 6, the OR gate and level shifter assembly 60 includes a power supply terminal 61 to which a single power supply voltage is applied. The power supply voltage VCC may be 3.3V, 2.5V or 5V. Circuit assembly 60 also includes two N-channel metal-oxide-semiconductor field-effect transistors (MOSFETs) Q2 and Q1 to which two input signals (In A and In B) are respectively applied. While N-channel MOSFETs are shown as examples, other types of transistors consistent with the principles of the invention may be used instead. A first resistor R1 is coupled between the power supply terminal 61 and a first node coupling the drains of Q1 and Q2. A second resistor R2 is coupled between ground 62 and a second node coupling the sources of Q1 and Q2. In an embodiment, the two resistors R1 and R2 may be small package resistors. The output of the combined logic OR operation and level shifting, indicated as OUT C, is coupled to the second node. The truth table for the OR logic performed by the circuit assembly 60 is shown in FIG. 7.

The N-channel MOSFETs (Q1 and Q2) may be configured such that the gate threshold voltage VGS of each matches the level of the corresponding input signal (IN B, IN A). Moreover, Q1 may be configured such that it is turned on and off by high and low levels of IN B, respectively. Likewise, Q2 may be configured such that it is turned on and off by high and low levels of IN A, respectively.

The output signal voltage (OUT C) is based on the required voltage level of the component to which it is applied, and can be determined by the VCC voltage, voltage across Q1 and Q2, and the values of the resistors. The delay in generating OUT C from the time of input of IN A and IN B, which is mainly dependent on the properties of the MOSFETs Q1 and Q2, is typically in the 5 ns-50 ns range, and the speed is >1 MHz for I/O operations.

One example of a 3.3V to 1.8V shift-down OR gate design is as follows. VCC=3.3V, IN A and IN B are each 3.3V level CMOS inputs, each of Q1 and Q2 is a Nexperia PMV40UN2 type N-channel Trench MOSFET with a low VGS of about 0.65V. R1 and R2 are 1K and 1.2K ohm resistors, respectively.

The above configuration provides the circuit assembly 60 with the following characteristics and attributes. CMOS input logic low: when 0.8V or less is applied to each input, the MOSFETs (Q1 and Q2) are barely turned on for a short time and the leakage current causes a small voltage on R2, thus further reducing VGS to less than VGS(min)=0.4V (from PMV40UN2 datasheet), thereby turning off Q1 and Q2. In this case, the output voltage is less than 0.4V. CMOS input logic high: when 2.5V-3.3V is applied to each input, the MOSFETs (Q1 and Q2) are fully turned on, as the input voltage is greater than VGS(max)=0.9V. Thus, current flows through R1 and R2, raising the voltage across them. Voltage feedback reduces VGS but Q1 and Q2 are still turned on, resulting in OUT C having an output voltage of about 1.8V. The calculation is shown below.

$$OUT C=VCC \times R2/(R1+R2)=3.3V \times 1.2K/(1K+1.2K)$$
$$=1.8V.$$

The actual VGS that turns on Q1 and Q2 is about 0.7V to 1.5V.

The circuit assembly 60, exemplified in FIG. 6, has the following advantages. A minimal number of NMOS transistors (two) are used, compared with other designs. Thus, circuit assembly 60 may be readily constructed. Moreover, circuit assembly 60 operates with a single power supply at the higher input logic level. No lower level voltage is required, as is the case with the circuits of FIGS. 4 and 5. Another advantage of circuit assembly 60 is that it has only four components (two transistors and two resistors); thus, circuit assembly 60 is less expensive and requires less space, as compared with the circuits of FIGS. 4 and 5. Still further, circuit assembly 60 is flexible in that it is able to operate on any of a range of VCC values, as well as different R1 and R2 values, to accommodate different applications.

Various applications for, and modifications of, the circuit assembly 60 are described below.

Figure 8:
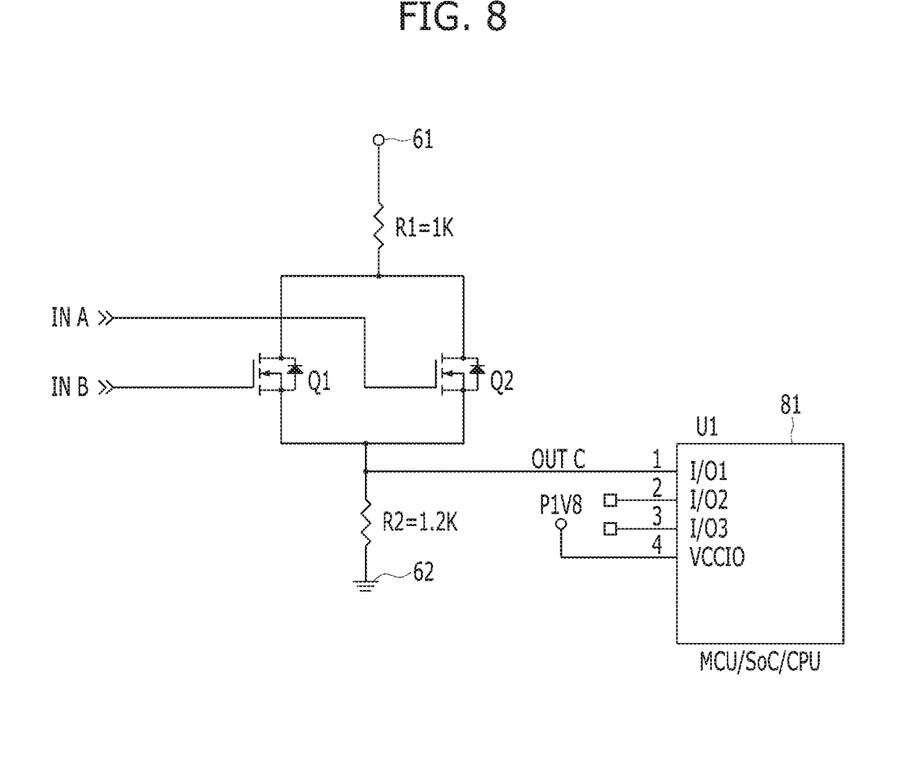
FIG. 8 is a circuit diagram illustrating an application of a circuit configured in accordance with an embodiment of the present invention.

One application is "glue logic" for MCU/SoC/CPU dual event detection. A circuit diagram for this application is shown in FIG. 8 as an example. Here, R1 is set at 1K ohms and R2 at 1.2K ohms. In this application, the input voltage signals (IN A and IN B) are "IC over temperature" indicators on the PCB, and IN A and IN B are pulled-up to 3.3V on board. MCU 81 operates on relatively low power using 1.8V for I/O operations. When the input signal In A has a voltage of 3.3V that indicates that an onboard NAND flash is over temperature, and an In A at 0V indicates that the temperature is normal. When the input signal In B is 3.3V that means an onboard DDR4 memory is over temperature, and In B=0V means that the temperature is normal. When any over temperature event occurs, the MCU 81 is alerted to trigger thermal throttling or planned shutdown.

Figure 9:
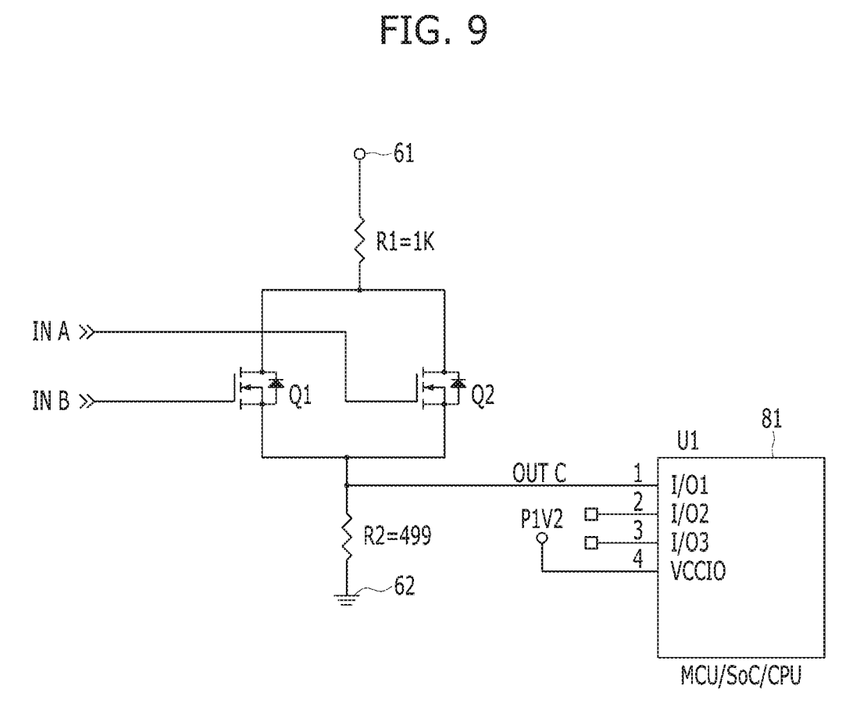
FIG. 9 is a circuit diagram illustrating another application of a circuit configured in accordance with an embodiment of the present invention.

Another application is OR logic with level shifting down to 1.2V, which is illustrated in FIG. 9. The circuit of FIG. 9 is the same as that of FIG. 8, except that R2 is adjusted down to 499 ohms. This results in an output signal (OUT C) of 1.2V, which is the operating voltage of the MCU 81.

Figure 10:
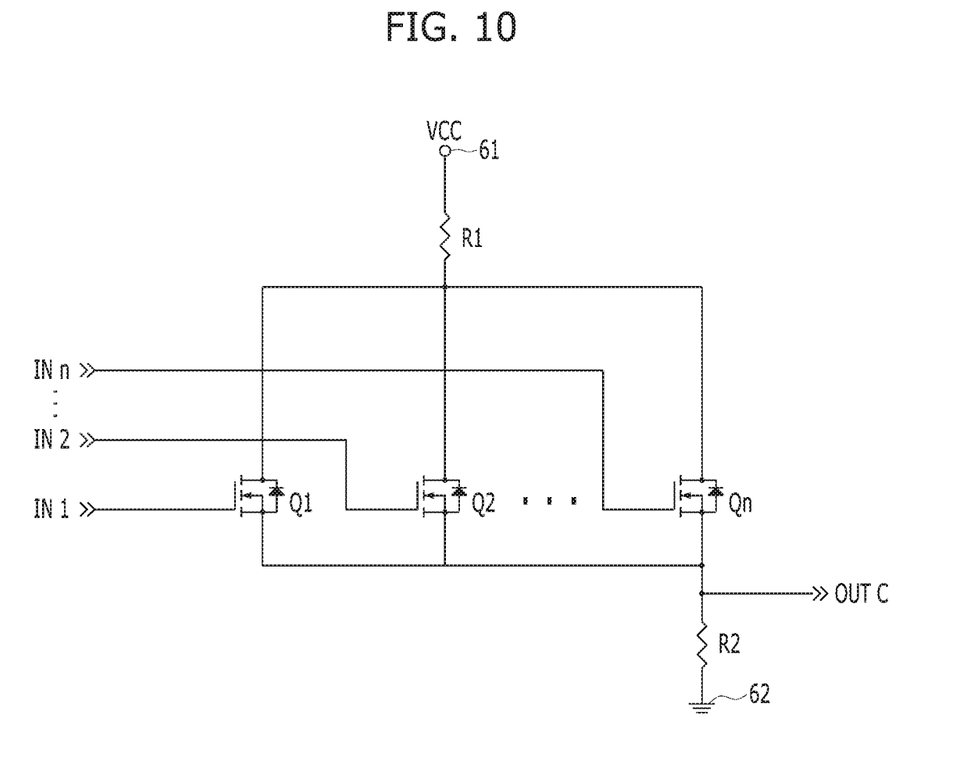
FIG. 10 is a circuit diagram illustrating a modification of the circuit of FIG. 6 configured in accordance with an embodiment of the present invention.

FIG. 10 is a circuit diagram illustrating an alternative circuit configuration according to an embodiment of the present invention. This configuration includes multiple, i.e., N, OR gates and a level shifter. There are N input signals, one for each of the N OR gates.

Figure 11:
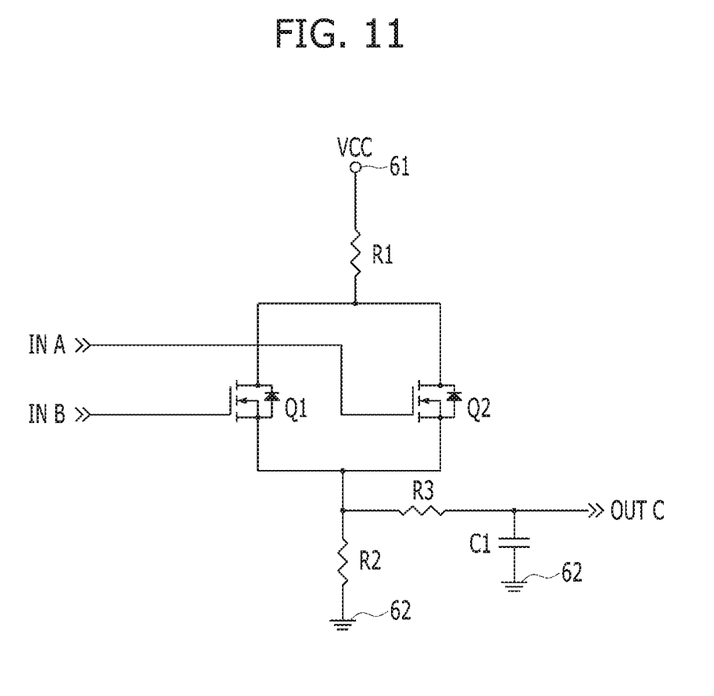
FIG. 11 is a circuit diagram illustrating another modification of the circuit of FIG. 6 configured in accordance with an embodiment of the present invention.

FIG. 11 is a circuit diagram illustrating another alternative circuit configuration according to an embodiment of the present invention. This configuration adds an RC circuit which delays the output signal (OUT C). Specifically, the RC circuit comprises a third resistor R3 coupled to the second node of the circuit (node coupling the sources of Q1 and Q2) to define a third node where the output signal (OUT C) is generated. A capacitor C1 is coupled between the third node and ground 62.

Figure 12:
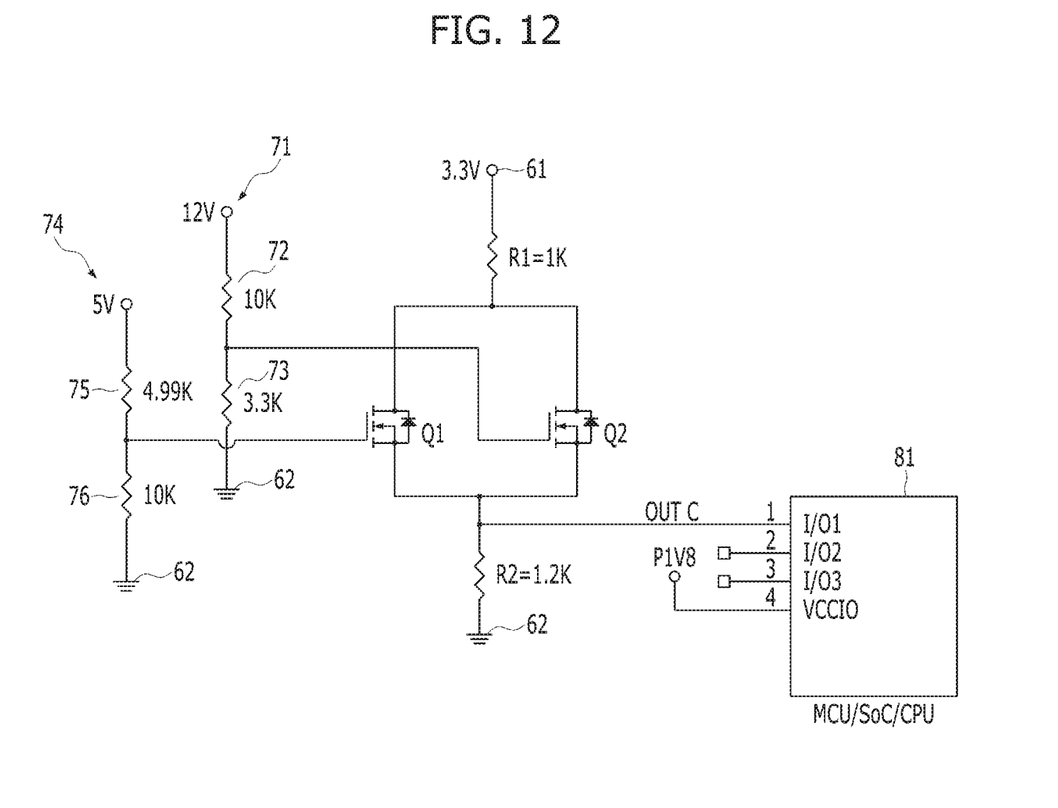
FIG. 12 is a circuit diagram illustrating still another modification of the circuit of FIG. 6 configured in accordance with an embodiment of the present invention.

FIG. 12 is a circuit diagram illustrating still another alternative circuit configuration that may be applied to MCU 81. The circuit of FIG. 12 adds a voltage divider to each of the inputs. Voltage divider 71 has a 12V power supply and two resistors 72, 73 coupled in series. The output of voltage divider 71 is applied as IN A to the gate of Q2. Voltage divider 74 has a 5V power supply and two resistors 75, 76 coupled in series. The output of voltage divider 72 is applied as IN B to the gate of Q1. In the illustrated embodiment, the resistors 72, 73 of the voltage divider 71 are 10K ohms and 3.3K ohms, respectively. As illustrated, the resistors 75, 76 of the voltage divider 74 are 4.99K ohms and 10K ohms, respectively. These are example values; each of the resistors 72, 73, 75 and 76 may have different values depending on the particular application. To that end, each of the resistors 72, 73, 75 and 76 may be variable resistors to control the input signal voltages.

In the circuit of FIG. 12, the output signal (OUT C) may be controlled by configuration of the voltage dividers 71 and 74. The pair of resistors in each voltage divider may be configured such that, when both 12V and 5V power supplies drop below certain thresholds, the output signal (OUT C) becomes logic low.

Figure 13:
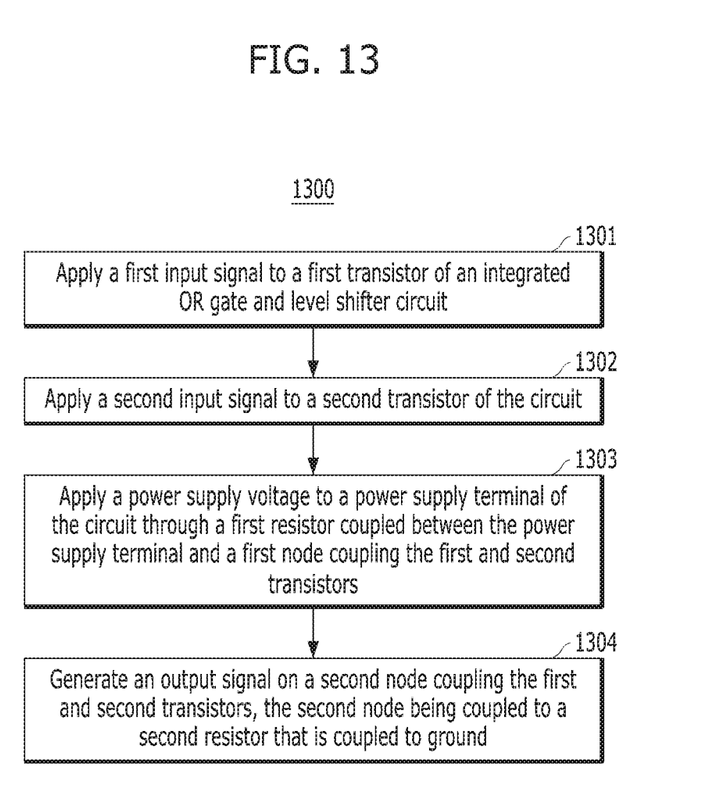
FIG. 13 is a flow chart illustrating a method of operating a circuit in accordance with an embodiment of the present invention.

An operation example of an integrated OR gate and level shifter, e.g., circuit assembly 60, is shown by flow chart 1300 of FIG. 13. FIG. 13 is described with reference to other figures, particularly FIG. 6. Those skilled in the art will understand from the present disclosure that additional and/or alternative steps may be performed, or that the order of steps may be changed, to effectuate aspects of the present invention is without departing from the inventive concepts disclosed herein.

Referring to FIG. 13, at step 1301, a first input signal, e.g., IN A, is applied to a first transistor, e.g., Q2, of an integrated OR gate and level shifter circuit, e.g., circuit assembly 60. At step 1302, a second input signal is applied to a second transistor, e.g., Q1, of the circuit, e.g., circuit assembly 60. At step 1303, a power supply voltage is applied to a power supply terminal of the circuit through a first resistor coupled between the power supply terminal and a first node coupling the first and second transistors. As those skilled in the art, steps 1301, 1302 and 1303 may be performed substantially at the same time.

As a result of application of the first and second input signals, as well as application of the power supply voltage, an output signal is generated on a second node coupling the first and second transistors, at step 1304. The second node is coupled to a second resistor that is also coupled to ground.

Various additional steps may be performed depending on the specific configuration and/or application of circuit assembly 60, several of which are described above.

As the foregoing demonstrates, embodiments of the present invention provide circuits that combine the functionality of OR gate(s) and a level shifter. The circuits may be employed in high density devices including high density storage devices. The circuits offer numerous advantages as compared with conventional configurations. Such advantages include a single power supply, smaller footprint, flexible values in terms of resistances and power supply voltage, as well as less components which, in turn, results in lower cost, lower complexity and less potential failure points. While achieving these design objectives, the circuits of the present invention also supports legacy components and devices. Various applications for the inventive circuits are also provided.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A circuit comprising:
    first and second transistors coupled in parallel defining first and second nodes, the first transistor being responsive to a first input signal and the second transistor being responsive to a second input signal;
    a first resistor coupled between a power supply terminal of the circuit and the first node; and
    a second resistor coupled between the second node and a ground terminal of the circuit,
    wherein the circuit generates an output signal having a voltage level that is lower than a voltage level of each of the first and second input signals,
    wherein the circuit further comprises:
    a third resistor coupled between the second node and a third node; and
    a capacitor coupled between the third node and the ground terminal, and
    wherein the output signal is generated at the third node.

2. The circuit of claim 1, wherein each of the first and second transistors is a metal-oxide-semiconductor field-effect transistor (MOSFET).

3. The circuit of claim 1, wherein each of the first and second resistors is a small package resistor.

4. The circuit of claim 1, wherein a power supply voltage applied to the power supply terminal is between 2.5V and 5V inclusive.

5. The circuit of claim 1, wherein the output signal is generated at the second node.

6. The circuit of claim 1, further comprising:
    one or more transistors coupled in parallel with each other and the first and second transistors, each of the one or more transistors being responsive to a corresponding input signal,
    wherein the voltage level of the output signal is lower than a voltage of each of the corresponding input signals and the voltage level of each of the first and second input signals.

7. The circuit of claim 1, wherein the first input signal is applied to a gate of the first transistor, and the second input signal is applied to a gate of the second transistor.

8. The circuit of claim 1, further comprising:
    a first voltage divider including a first pair of resistors coupled to define a node in between that is coupled to the gate of the first transistor; and
    a second voltage divider including a second pair of resistors coupled to define a node in between that is coupled to the gate of the second transistor.

9. The circuit of claim 8, wherein the voltage level of the output signal is controlled by a resistance value of at least one of the resistors of the first pair of resistors or a resistance value of at least one of the resistors of the second pair of resistors.

10. A method of operating a circuit, the method comprising:
    applying a first input signal to a first transistor of the circuit;
    applying a second input signal to a second transistor of the circuit, the second transistor being coupled in parallel with the first transistor;
    applying a power supply voltage to a power supply terminal of the circuit through a first resistor coupled between the power supply terminal and a first node coupling the first and second transistors;
    generating an output signal on a second node coupling the first and second transistors, the second node being coupled to a second resistor that is coupled to ground; and
    delaying the output signal,
    wherein the output signal generated has a voltage level that is lower than a voltage level of each of the first and second input signals.

11. The method of claim 10, further comprising:
    applying the output signal to a microcontroller (MCU);
    detecting a specific event occurring on the MCU based on configuration of the first and second input signals; and
    alerting the MCU when the specific event is detected.

12. The method of claim 11, wherein the specific event is exceeding a set temperature.

13. The method of claim 10, further comprising:
    adjusting resistance values of the first and second resistors to control the voltage level of the output signal.

14. The method of claim 10, further comprising:
    generating the first input signal using a first voltage divider; and
    generating the second input signal using a second voltage divider.

15. The method of claim 14, further comprising:
    varying a resistance component of either or both of the first and second voltage dividers to control the voltage level of the output signal.

16. The method of claim 14, further comprising:
    setting a resistance component of each of the first and second voltage dividers such that the voltage level of the output signal corresponds to logic low when the voltages of both power supplies drop below certain voltage levels.

* * * * *